(12) United States Patent
Kono et al.

(10) Patent No.: US 8,710,610 B2
(45) Date of Patent: Apr. 29, 2014

(54) SOLID-STATE IMAGING APPARATUS AND IMAGING SYSTEM

(75) Inventors: Shoji Kono, Hachioji (JP); Shin Kikuchi, Isehara (JP); Yuichiro Yamashita, Ebina (JP); Masaru Fujimura, Yokohama (JP); Shinichiro Shimizu, Yokohama (JP); Yu Arishima, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 118 days.

(21) Appl. No.: 13/167,408

(22) Filed: Jun. 23, 2011

(65) Prior Publication Data

US 2012/0007203 A1 Jan. 12, 2012

(30) Foreign Application Priority Data

Jul. 7, 2010 (JP) .................. 2010-155259

(51) Int. Cl.
*H01L 27/146* (2006.01)

(52) U.S. Cl.
USPC ............ 257/435; 257/E31.122; 257/E31.11

(58) Field of Classification Search
USPC ............ 257/435, E31.11, E31.122, E31.032
See application file for complete search history.

(56) References Cited

U.S. PATENT DOCUMENTS

| | | | |
|---|---|---|---|
| 3,364,822 A | 1/1968 | Gutkowski | |
| 4,386,327 A | 5/1983 | Ogawa | |
| 4,954,895 A | 9/1990 | Akimoto et al. | 358/213.11 |
| 5,120,199 A | 6/1992 | Youngs et al. | |
| 5,245,203 A | 9/1993 | Morishita et al. | |
| 5,352,920 A | 10/1994 | Morishita et al. | |
| 5,506,430 A * | 4/1996 | Ohzu | 257/292 |
| 6,057,586 A * | 5/2000 | Bawolek et al. | 257/435 |
| 6,239,839 B1 | 5/2001 | Matsunaga et al. | 348/308 |
| 6,780,666 B1 | 8/2004 | McClure | 438/57 |
| 6,900,480 B2 | 5/2005 | Sugiyama | 257/222 |
| 6,906,793 B2 | 6/2005 | Bamji et al. | 356/141.1 |

(Continued)

FOREIGN PATENT DOCUMENTS

| | | |
|---|---|---|
| CN | 1604655 A | 4/2005 |
| CN | 1697493 A | 11/2005 |

(Continued)

OTHER PUBLICATIONS

Pending Unpublished U.S. Appl. No. 13/945,580; Inventor: Yu Arishima, et al., filed Jul. 18, 2013. (Pursuant to 1287 Off. Gaz. Pat. Office 163).

*Primary Examiner* — Wael Fahmy
*Assistant Examiner* — Sarah Salerno
(74) *Attorney, Agent, or Firm* — Fitzpatrick, Cella, Harper & Scinto (57) ABSTRACT

A solid-state imaging apparatus including pixels each including a photoelectric conversion element, and a light shielding layer covering the photoelectric conversion element is provided. For each of the photoelectric conversion elements, the light shielding layer includes a light shielding portion which shields a portion of incident light to the photoelectric conversion element, and an aperture which passes another portion of the incident light. The pixels include first and second pixels which have different areas on a planar view of the photoelectric conversion element. The area of the photoelectric conversion element in the first pixel is larger than the area of the photoelectric conversion element in the second pixel on the planar view. An area of the light shielding portion included in the first pixel is larger than an area of the light shielding portion included in the second pixel.

8 Claims, 9 Drawing Sheets

(56) References Cited

U.S. PATENT DOCUMENTS

| | | | |
|---|---|---|---|
| 6,960,751 B2 | 11/2005 | Hiyama et al. | |
| 6,965,135 B2 | 11/2005 | Sugiyama | 257/222 |
| 6,969,877 B2 | 11/2005 | Sugiyama | 257/222 |
| 6,974,980 B2 | 12/2005 | Sugiyama | 257/222 |
| 7,016,089 B2 | 3/2006 | Yoneda et al. | |
| 7,106,843 B1 | 9/2006 | Gainsboro et al. | |
| 7,288,428 B2 | 10/2007 | Muramatsu | |
| 7,321,110 B2 | 1/2008 | Okita et al. | |
| 7,348,615 B2 | 3/2008 | Koizumi | |
| 7,408,210 B2 | 8/2008 | Ogura et al. | |
| 7,427,789 B2 | 9/2008 | Muramatsu | |
| 7,429,764 B2 | 9/2008 | Koizumi et al. | |
| 7,456,888 B2 | 11/2008 | Kikuchi | |
| 7,460,162 B2 | 12/2008 | Koizumi et al. | |
| 7,470,893 B2 | 12/2008 | Suzuki et al. | |
| 7,547,871 B2 | 6/2009 | Hiyama et al. | |
| 7,550,793 B2 | 6/2009 | Itano et al. | |
| 7,554,591 B2 | 6/2009 | Kikuchi et al. | |
| 7,557,847 B2 | 7/2009 | Okita et al. | |
| 7,623,056 B2 | 11/2009 | Yamashita | |
| 7,633,539 B2 | 12/2009 | Yamashita | 348/294 |
| 7,679,658 B2 | 3/2010 | Sakurai et al. | |
| 7,755,688 B2 | 7/2010 | Hatano et al. | |
| 7,808,537 B2 | 10/2010 | Fujimura et al. | 348/300 |
| 7,817,199 B2 | 10/2010 | Yamashita et al. | 348/308 |
| 7,852,393 B2 | 12/2010 | Kikuchi et al. | 348/308 |
| 7,859,587 B2 | 12/2010 | Katsuno et al. | 348/340 |
| 7,907,196 B2 | 3/2011 | Ogura et al. | |
| 7,916,195 B2 | 3/2011 | Kudoh | 348/294 |
| 7,928,477 B2 | 4/2011 | Kobayashi et al. | |
| 7,948,540 B2 | 5/2011 | Ogura et al. | |
| 7,961,237 B2 | 6/2011 | Hatano et al. | 348/300 |
| 8,269,872 B2 | 9/2012 | Okumura | |
| 8,279,313 B2 | 10/2012 | Rhodes | |
| 8,293,565 B2 * | 10/2012 | Ootake | 438/73 |
| 8,330,195 B2 | 12/2012 | Venezia et al. | 257/294 |
| 8,411,157 B2 | 4/2013 | Gomi et al. | |
| 8,462,252 B2 | 6/2013 | Wada | |
| 8,508,642 B2 | 8/2013 | Tanaka | |
| 8,525,906 B2 | 9/2013 | Ui | |
| 8,569,805 B2 | 10/2013 | Sugawa et al. | |
| 2001/0013901 A1 | 8/2001 | Matsunaga et al. | 348/308 |
| 2002/0050940 A1 | 5/2002 | Sato et al. | 341/155 |
| 2002/0149688 A9 | 10/2002 | Matsunaga et al. | 348/308 |
| 2002/0163583 A1 | 11/2002 | Jones | 348/272 |
| 2003/0160887 A1 | 8/2003 | Takahashi | 348/350 |
| 2003/0164887 A1 | 9/2003 | Koizumi et al. | 348/308 |
| 2003/0169360 A1 | 9/2003 | Rhodes | 348/308 |
| 2004/0130757 A1 | 7/2004 | Mabuchi | |
| 2004/0169751 A1 * | 9/2004 | Takemura et al. | 348/294 |
| 2005/0018065 A1 | 1/2005 | Tashiro et al. | 348/308 |
| 2005/0032281 A1 | 2/2005 | McClure | |
| 2005/0127415 A1 | 6/2005 | Yuzurihara et al. | 257/292 |
| 2005/0179796 A1 | 8/2005 | Okita et al. | |
| 2005/0231656 A1 * | 10/2005 | den Boer et al. | 349/42 |
| 2005/0253945 A1 | 11/2005 | Shinohara | 348/300 |
| 2006/0082669 A1 | 4/2006 | Inoue et al. | 348/308 |
| 2006/0187329 A1 | 8/2006 | Panicacci | 348/308 |
| 2006/0243883 A1 | 11/2006 | Yahazu et al. | 250/208.1 |
| 2007/0109437 A1 | 5/2007 | Funaki et al. | 348/308 |
| 2007/0205354 A1 | 9/2007 | Li | 250/208.1 |
| 2007/0258000 A1 | 11/2007 | Kondo | 348/308 |
| 2007/0290143 A1 | 12/2007 | Kameshima et al. | |
| 2008/0068480 A1 | 3/2008 | Okita et al. | 348/294 |
| 2008/0170143 A1 | 7/2008 | Yoshida | |
| 2008/0273093 A1 | 11/2008 | Okita et al. | |
| 2008/0283884 A1 | 11/2008 | Park | |
| 2009/0027529 A1 | 1/2009 | Jung et al. | |
| 2009/0085135 A1 | 4/2009 | Bang | 257/432 |
| 2009/0134433 A1 | 5/2009 | Jung | 257/239 |
| 2009/0160983 A1 | 6/2009 | Lenchenkov | |
| 2009/0174799 A1 | 7/2009 | Lee et al. | |
| 2009/0201400 A1 | 8/2009 | Zhang et al. | 348/296 |
| 2009/0201406 A1 | 8/2009 | Okita et al. | |
| 2009/0218479 A1 | 9/2009 | Arishima et al. | |
| 2009/0244328 A1 | 10/2009 | Yamashita | 348/241 |
| 2009/0251578 A1 | 10/2009 | Yamashita | 348/302 |
| 2009/0284632 A1 | 11/2009 | Onuki et al. | |
| 2009/0303364 A1 | 12/2009 | Shibata et al. | 348/302 |
| 2010/0002114 A1 | 1/2010 | Ogura et al. | 348/301 |
| 2010/0053398 A1 | 3/2010 | Yamashita | |
| 2010/0066877 A1 | 3/2010 | Yamaguchi et al. | |
| 2010/0078692 A1 * | 4/2010 | Lim | 257/292 |
| 2010/0079635 A1 | 4/2010 | Yano et al. | 348/294 |
| 2010/0079636 A1 | 4/2010 | Aoki et al. | |
| 2010/0084728 A1 * | 4/2010 | Yamada | 257/432 |
| 2010/0148289 A1 | 6/2010 | McCarten et al. | |
| 2010/0149366 A1 | 6/2010 | Noda et al. | 348/222.1 |
| 2010/0165159 A1 | 7/2010 | Kumesawa | 348/294 |
| 2010/0165167 A1 | 7/2010 | Sugiyama et al. | |
| 2010/0182465 A1 | 7/2010 | Okita | |
| 2010/0198482 A1 | 8/2010 | Hartmann et al. | 701/103 |
| 2010/0200738 A1 | 8/2010 | Yamashita | |
| 2010/0201834 A1 | 8/2010 | Maruyama et al. | 348/222.1 |
| 2010/0225776 A1 | 9/2010 | Taura | |
| 2010/0225793 A1 | 9/2010 | Matsuda et al. | |
| 2010/0231767 A1 | 9/2010 | Kikuchi | |
| 2010/0259658 A1 | 10/2010 | Konishi | |
| 2010/0271517 A1 | 10/2010 | De Wit et al. | |
| 2010/0291729 A1 | 11/2010 | Kawano | |
| 2010/0309357 A1 | 12/2010 | Oike | |
| 2010/0327148 A1 | 12/2010 | Chung et al. | 250/208.1 |
| 2010/0328302 A1 | 12/2010 | Yamashita et al. | |
| 2010/0328509 A1 | 12/2010 | Yamashita et al. | |
| 2010/0328510 A1 | 12/2010 | Hiyama et al. | |
| 2011/0001861 A1 | 1/2011 | Tanaka et al. | 348/300 |
| 2011/0007173 A1 | 1/2011 | Takenaka et al. | |
| 2011/0007196 A1 | 1/2011 | Yamashita et al. | |
| 2011/0013062 A1 | 1/2011 | Yamashita | |
| 2011/0025892 A1 | 2/2011 | Hibbeler et al. | |
| 2011/0025896 A1 | 2/2011 | Yamashita et al. | 348/294 |
| 2011/0032379 A1 | 2/2011 | Kobayashi et al. | |
| 2011/0032404 A1 | 2/2011 | Kikuchi | |
| 2011/0068253 A1 | 3/2011 | Arishima et al. | 250/208.1 |
| 2011/0080492 A1 | 4/2011 | Matsuda et al. | |
| 2011/0080493 A1 | 4/2011 | Kono et al. | |
| 2011/0084197 A1 | 4/2011 | Sugawa et al. | |
| 2011/0085064 A1 | 4/2011 | Nishide | |
| 2011/0121404 A1 | 5/2011 | Shifren et al. | 257/392 |
| 2011/0134270 A1 | 6/2011 | Arishima et al. | |
| 2011/0157441 A1 | 6/2011 | Okita et al. | 348/301 |
| 2011/0163407 A1 | 7/2011 | Yuzurihara et al. | 257/463 |
| 2011/0168872 A1 | 7/2011 | Kobayashi et al. | 250/208.1 |
| 2011/0169989 A1 | 7/2011 | Kono et al. | |
| 2011/0234868 A1 | 9/2011 | Yamashita et al. | |
| 2011/0242380 A1 | 10/2011 | Ogura et al. | 348/300 |
| 2012/0026371 A1 | 2/2012 | Itano et al. | |
| 2013/0015535 A1 | 1/2013 | Yang et al. | 257/408 |

FOREIGN PATENT DOCUMENTS

| | | |
|---|---|---|
| CN | 1764244 A | 4/2006 |
| CN | 101043046 A | 9/2007 |
| CN | 101197386 A | 6/2008 |
| CN | 101395718 A | 3/2009 |
| CN | 101685188 A | 3/2010 |
| EP | 1930950 A2 | 6/2008 |
| JP | 01-295458 A | 11/1989 |
| JP | 03-256359 A | 11/1991 |
| JP | 04-206773 A | 7/1992 |
| JP | 06-045577 A | 2/1994 |
| JP | 07-058308 A | 3/1995 |
| JP | 2002-026302 A | 1/2002 |
| JP | 2002-044522 A | 2/2002 |
| JP | 2002-051262 A | 2/2002 |
| JP | 2002-090462 A | 3/2002 |
| JP | 2002-199292 A | 7/2002 |
| JP | 2002-344809 A | 11/2002 |
| JP | 2003-218332 A | 7/2003 |
| JP | 2003-318381 A | 11/2003 |
| JP | 2003-329777 A | 11/2003 |
| JP | 2005-228956 A | 8/2005 |
| JP | 2006-147709 A | 6/2006 |
| JP | 2006-310933 A | 11/2006 |

(56) References Cited

FOREIGN PATENT DOCUMENTS

| | | |
|---|---|---|
| JP | 2007-081083 A | 3/2007 |
| JP | 2007-300521 A | 11/2007 |
| JP | 2008-177191 A | 7/2008 |
| KR | 10-2008-0033881 A | 4/2008 |
| WO | 00/26966 A | 5/2000 |
| WO | 2009/146253 A1 | 12/2009 |

\* cited by examiner

SOLID-STATE IMAGING APPARATUS AND IMAGING SYSTEM

BACKGROUND OF THE INVENTION

1. Field of the Invention

The present invention relates to a solid-state imaging apparatus and an imaging system.

2. Description of the Related Art

Sensor panels used in solid-state imaging apparatuses are becoming large in recent years. Along with the upsizing of sensor panels, a technique of tiling a plurality of imaging blocks to implement a large-sized sensor panel has come into general use. Several problems are known to arise when bonding the plurality of imaging blocks. In Japanese Patent Laid-Open No. 2002-90462, line defects are problematic, which are caused by tiling imaging blocks with scanning circuits and the like arranged at the periphery of the pixel array. In this reference, the scanning circuits and the like are arranged in unit cells to solve the problem, as shown in FIG. 7 of this reference. When the scanning circuits and the like are arranged in the unit cells, the area of each unit cell including the scanning circuits and the like is smaller than that of a unit cell including no scanning circuits and the like on the planar view of the photoelectric conversion elements. In Japanese Patent Laid-Open No. 2002-44522, adjacent pixels on both sides of the gap between imaging blocks is wider than the gap between adjacent pixels in an imaging block, and resultant image distortion poses a problem. In this reference, to solve the problem, the area of pixels closest to the edge of an imaging block is made smaller than that of the remaining pixels on the planar view of the photoelectric conversion elements, as shown in FIG. 7. This unifies the distances between the centers of gravity of photoelectric conversion elements across the plurality of imaging blocks.

SUMMARY OF THE INVENTION

As described above, when the solid-state imaging apparatus includes pixels with different photoelectric conversion element areas, the sensitivity varies between the pixels. Hence, an aspect of the present invention provides a technique of reducing the sensitivity variation between pixels in a solid-state imaging apparatus including pixels with different photoelectric conversion element areas.

A first aspect of the present invention provides a solid-state imaging apparatus including a plurality of pixels each including a photoelectric conversion element, and a light shielding layer covering the photoelectric conversion element, wherein for each of the photoelectric conversion elements of the plurality of pixels, the light shielding layer includes a light shielding portion which shields a portion of incident light to the photoelectric conversion element, and an aperture which passes another portion of the incident light, the plurality of pixels include a first pixel and a second pixel which have different areas on a planar view of the photoelectric conversion element, the area of the photoelectric conversion element included in the first pixel is larger than the area of the photoelectric conversion element included in the second pixel on the planar view, and an area of the light shielding portion that shields a portion of the incident light to the photoelectric conversion element included in the first pixel is larger than an area of the light shielding portion that shields a portion of the incident light to the photoelectric conversion element included in the second pixel.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Figure 1A:
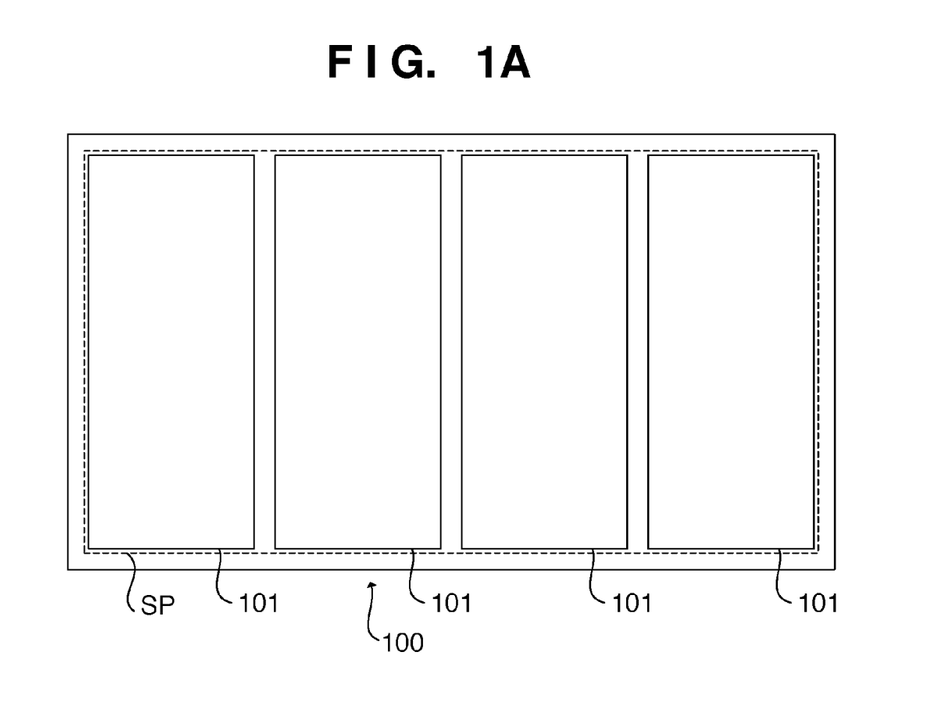
FIGS. 1A and 1B explain an example of the schematic arrangement of a solid-state imaging apparatus according to an embodiment of the present invention.
Figure 1B:
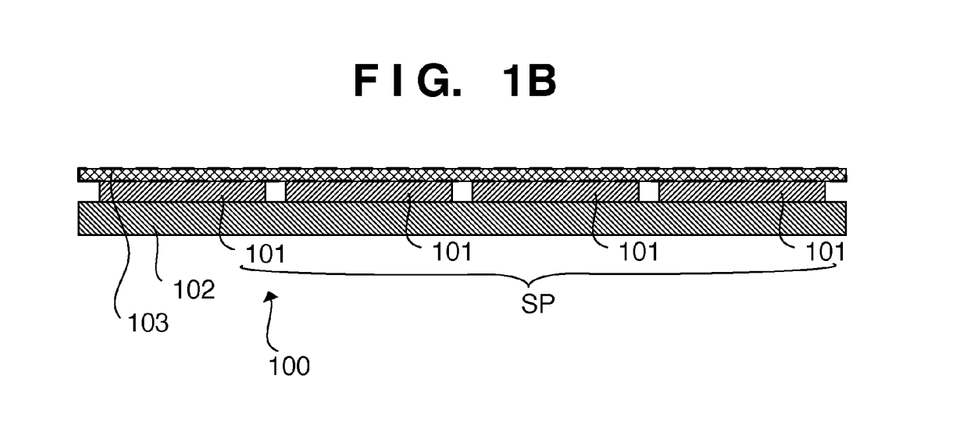

The schematic arrangement of a solid-state imaging apparatus 100 according to an embodiment of the present invention will be described with reference to FIGS. 1A and 1B. The solid-state imaging apparatus 100 can be formed by, for example, arraying a plurality of imaging blocks 101. In this case, an array of a plurality of imaging blocks 101 can form a sensor panel SP having one imaging region. The plurality of imaging blocks 101 can be arranged on a support substrate 102. When the solid-state imaging apparatus 100 uses a single imaging block 101, the single imaging block 101 forms the sensor panel SP. Each of the plurality of imaging blocks 101 may be provided by, for example, forming a circuit element on a semiconductor substrate or forming a semiconductor layer on, for example, a glass substrate and forming a circuit element on the semiconductor layer. Each of the plurality of imaging blocks 101 has a pixel array in which a plurality of pixels are arrayed so as to form pluralities of rows and columns.

The solid-state imaging apparatus 100 may serve as an apparatus which captures an image of radiation such as X-rays or an apparatus which captures an image of visible light. When the solid-state imaging apparatus 100 serves as an apparatus which captures an image of radiation, a scintillator 103 which converts radiation into visible light can typically be provided on the sensor panel SP. The scintillator 103 converts radiation into visible light, which strikes the sensor panel SP and is photoelectrically converted by each photoelectric conversion element on the sensor panel SP (imaging block 101).

Figure 2:
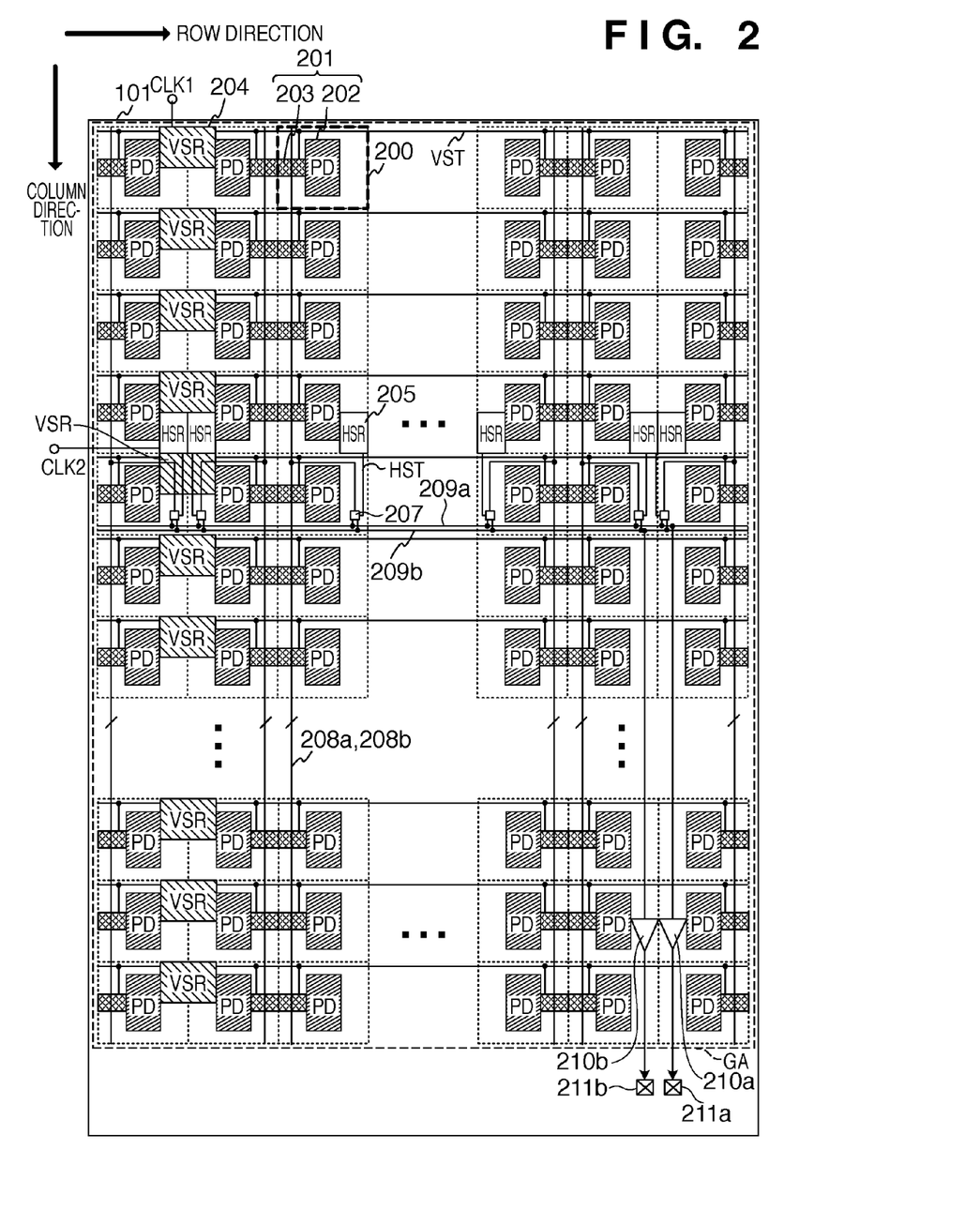
FIG. 2 explains an example of the arrangement of an imaging block according to the embodiment of the present invention.

An example of the arrangement of each imaging block 101 will be described next with reference to FIG. 2. When the solid-state imaging apparatus 100 uses a single imaging block 101, the single imaging block 101 can be regarded as a solid-state imaging apparatus. The imaging block 101 has a pixel array GA in which a plurality of pixels 201 are arrayed so as to form pluralities of rows and columns and a plurality of column signal lines 208a are arranged. Each of the plurality of pixels 201 includes a photoelectric conversion element (for example, a photodiode) 202, and an in-pixel readout circuit 203 which outputs a signal (light signal) corresponding to a charge generated by the photoelectric conversion element 202 to the column signal line 208a. In the pixel array GA, a plurality of column signal lines 208b may further be arranged, and the in-pixel readout circuit 203 can be configured to output noise generated by itself to the column signal line 208b in this case. In-pixel readout circuits 203 of two adjacent pixels 201 aligned in the row direction can be axisymmetrically arranged to have, for example, the boundary line between the two pixels 201 as their symmetry axis.

The imaging block 101 includes vertical scanning circuits 204 and horizontal scanning circuits 205. Although the vertical scanning circuit 204 can be placed, for example, between the photoelectric conversion elements 202 on two adjacent columns, it may be placed outside the photoelectric conversion element 202 on the outermost column in the pixel array GA. The vertical scanning circuit 204 includes, for example, a vertical shift register which performs a shift operation in accordance with a first clock CLK1, and scans a plurality of rows in the pixel array GA in accordance with the shift operation by the vertical shift register. The vertical shift register is formed by connecting a plurality of registers in series, and a pulse received by a register in the first stage is sequentially transferred to registers in subsequent stages in accordance with the first clock CLK1. A row corresponding to a register which holds a pulse is to be selected.

Although the horizontal scanning circuit 205 can be placed, for example, between the photoelectric conversion elements 202 on two adjacent rows, it may be placed outside the photoelectric conversion element 202 on the outermost row in the pixel array GA. The horizontal scanning circuit 205 includes, for example, a horizontal shift register which performs a shift operation in accordance with a second clock CLK2, and scans a plurality of columns in the pixel array GA in accordance with the shift operation by the horizontal shift register. The horizontal shift register is formed by connecting a plurality of registers in series, and a pulse received by a register in the first stage is sequentially transferred to registers in subsequent stages in accordance with the second clock CLK2. A column corresponding to a register which holds a pulse is to be selected.

The vertical scanning circuit 204 can be formed by vertically arraying a plurality of unit vertical scanning circuits VSR each including one register that constitutes the vertical shift register. Each unit vertical scanning circuit VSR can be placed in the region sandwiched by a photoelectric conversion element 202 of a pixel belonging to a given column (the leftmost column (that is, the first column) in FIG. 2) and a photoelectric conversion element 202 of a pixel belonging to a column adjacent to the given column (the second column from the left (that is, the second column) in FIG. 2). When a pulse is transferred via the vertical shift register, each unit vertical scanning circuit VSR drives a row select signal VST to active level so that pixels 201 on a row to which it belongs are selected. A light signal and noise from the pixel 201 on the selected row are output to the column signal lines 208a and 208b, respectively. Referring to FIG. 2, the column signal lines 208a and 208b are indicated by a single line. Pulse signals (start pulses) PULSE1 and PULSE2 are supplied to the input terminals (not shown) of the vertical scanning circuit 204 and horizontal scanning circuit 205, respectively.

The horizontal scanning circuit 205 can be formed by horizontally arraying a plurality of unit horizontal scanning circuits HSR each including one register that constitutes the horizontal shift register. Each unit horizontal scanning circuit HSR is placed in the region sandwiched by two photoelectric conversion elements 202 in each pair of two adjacent pixels (a pair of pixels on the first and second columns, a pair of pixels on the third and fourth columns, ... ) belonging to one row (the fourth row from the top (that is, the fourth row) in FIG. 2). However, each unit horizontal scanning circuit HSR is not placed in the region sandwiched by two photoelectric conversion elements 202 in two adjacent pixels aligned in the column direction. This arrangement is advantageous to reduce the gap between the photoelectric conversion elements 202 in the column direction. When a pulse is transferred via the horizontal shift register, each unit horizontal scanning circuit HSR controls a switch 207 so that a column to which it belongs is selected, that is, the column signal lines 208a and 208b on this column are connected to horizontal signal lines 209a and 209b, respectively. That is, a light signal and noise from the pixel 201 on the selected row are output to the column signal lines 208a and 208b, respectively, and signals from the selected column (that is, the selected column signal lines 208a and 208b) are output to the horizontal signal lines 209a and 209b. This implements X-Y addressing. The horizontal signal lines 209a and 209b are connected to the inputs of output amplifiers 210a and 210b, respectively, and signals output to the horizontal signal lines 209a and 209b are amplified by the output amplifiers 210a and 210b, respectively, and output via pads 211a and 211b, respectively.

The pixel array GA can be regarded as being obtained by arraying a plurality of unit cells 200 each including the pixel 201 so as to form pluralities of rows and columns. The unit cells 200 can include several types. A certain unit cell 200 includes at least part of the unit vertical scanning circuit VSR. Although a set of two unit cells 200 includes only one unit vertical scanning circuit VSR in the example shown in FIG. 2, one unit cell 200 may include one unit vertical scanning circuit VSR or a set of three or more unit cells 200 may include one unit vertical scanning circuit VSR. Another unit cell 200 includes at least part of the unit horizontal scanning circuit HSR. Although one unit cell 200 includes one unit horizontal scanning circuit HSR in the example shown in FIG. 2, a set of a plurality of unit cells 200 may include one unit vertical scanning circuit VSR. Still another unit cell 200 includes both at least part of the unit vertical scanning circuit VSR and at least part of the unit horizontal scanning circuit HSR. Still another unit cell 200 includes, for example, a unit cell including at least part of the output amplifier 210a, a unit cell including at least part of the output amplifier 210b, and a unit cell including the switch 207.

An example of the arrangement of each pixel 201 will be described with reference to FIG. 3. The pixel 201 includes the photoelectric conversion element 202 and in-pixel readout circuit 203, as described earlier. The photoelectric conversion element 202 can typically be a photodiode. The in-pixel readout circuit 203 can include, for example, a first amplifier circuit 310, a clamp circuit 320, a light signal sample-and-hold circuit 340, and a noise sample-and-hold circuit 360, and NMOS transistors 343 and 363 and row select switches 344 and 364 in a second amplifier circuit.

The photoelectric conversion element 202 includes a charge storage unit, which is connected to the gate of a PMOS transistor 303 of the first amplifier circuit 310. The source of the PMOS transistor 303 is connected to a current source 305 via a PMOS transistor 304. A first source follower circuit is formed using the PMOS transistor 303 and current source 305. Forming a source follower circuit using the PMOS transistor 303 is effective in reducing 1/f noise. The PMOS transistor 304 serves as an enable switch which enables the first source follower circuit upon being turned on when an enable signal EN supplied to its gate changes to active level. The first amplifier circuit 310 outputs a signal corresponding to the potential of a charge/voltage conversion unit CVC to an intermediate node n1.

Figure 3:
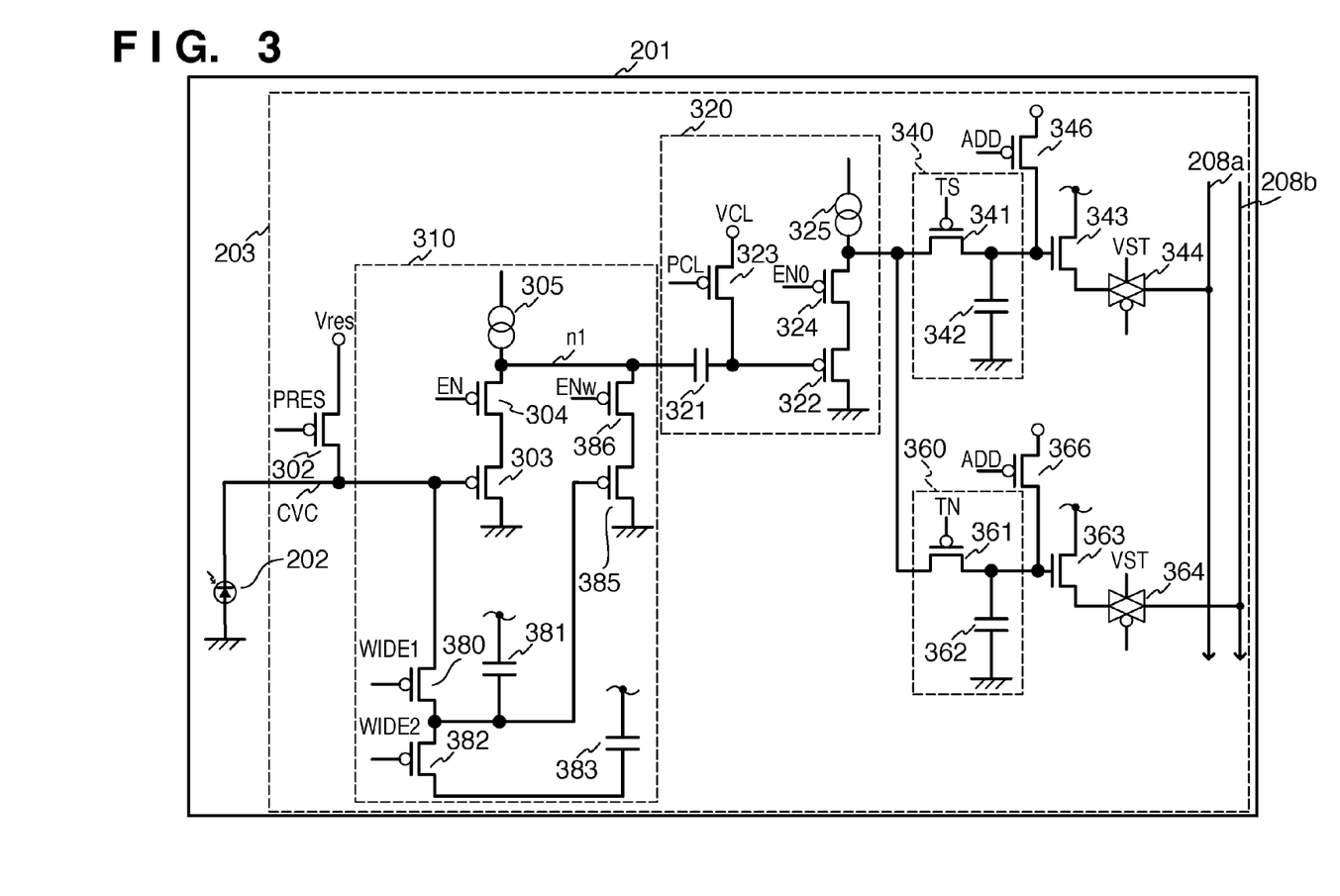
FIG. 3 explains an example of the arrangement of a pixel according to the embodiment of the present invention.

In the example shown in FIG. 3, the charge storage unit of the photoelectric conversion element 202 and the gate of the PMOS transistor 303 form a common node, which functions as the charge/voltage conversion unit CVC which changes a charge stored in the charge storage unit to a voltage. That is, the charge/voltage conversion unit CVC has the voltage V (=Q/C) determined by the charge Q stored in the charge storage unit and the capacitance value C of the charge/voltage conversion unit CVC. The charge/voltage conversion unit CVC is connected to a reset potential $V_{res}$ via a PMOS transistor 302 serving as a reset switch. When a reset signal PRES changes to active level, the PMOS transistor 302 is turned on, so the potential of the charge/voltage conversion unit CVC is reset to the reset potential $V_{res}$.

The clamp circuit 320 uses a clamp capacitance 321 to clamp noise output to the intermediate node n1 by the first amplifier circuit 310 in accordance with the reset potential of the charge/voltage conversion unit CVC. In other words, the clamp circuit 320 is a circuit for canceling that noise from a signal output from the first source follower circuit to the intermediate node n1 in accordance with the charge generated by the photoelectric conversion element 202. The noise output to the intermediate node n1 contains kTC noise produced upon resetting. Clamping is done by changing a clamp signal PCL to active level to turn on a PMOS transistor 323, and thereupon changing the clamp signal PCL to inactive level to turn off the PMOS transistor 323. The output terminal of the clamp capacitance 321 is connected to the gate of a PMOS transistor 322. The source of the PMOS transistor 322 is connected to a current source 325 via a PMOS transistor 324. A second source follower circuit is formed using the PMOS transistor 322 and current source 325. The PMOS transistor 324 serves as an enable switch which enables the second source follower circuit upon being turned on when an enable signal EN0 supplied to its gate changes to active level.

A signal output from the second source follower circuit in accordance with the charge generated by photoelectric conversion by the photoelectric conversion element 202 is written in a capacitance 342 as a light signal via a switch 341 when a light signal sampling signal TS changes to active level. A signal output from the second source follower circuit upon turning on the PMOS transistor 323 immediately after the potential of the charge/voltage conversion unit CVC is reset is noise. This noise is written in a capacitance 362 via a switch 361 when a noise sampling signal TN changes to active level. This noise contains the offset component of the second source follower circuit.

When the unit vertical scanning circuit VSR of the vertical scanning circuit 204 drives the row select signal VST to active level, a signal (light signal) held in the capacitance 342 is output to the column signal line 208a via the NMOS transistor 343 and row select switch 344 in the second amplifier circuit. At the same time, a signal (noise) held in the capacitance 362 is output to the column signal line 208b via the NMOS transistor 363 and row select switch 364 in the second amplifier circuit. The NMOS transistor 343 in the second amplifier circuit and a constant current source (not shown) provided on the column signal line 208a form a source follower circuit. Similarly, the NMOS transistor 363 in the second amplifier circuit and a constant current source (not shown) provided on the column signal line 208b form a source follower circuit.

The pixel 201 may include an add switch 346 which adds light signals from a plurality of adjacent pixels 201. In an add mode, an add mode signal ADD changes to active level, so the add switch 346 is turned on. Thus, the add switch 346 connects the capacitances 342 of adjacent pixels 201 to each other, thereby averaging the light signals. Similarly, the pixel 201 may include an add switch 366 which adds noise signals from a plurality of adjacent pixels 201. When the add switch 366 is turned on, the add switch 366 connects the capacitances 362 of adjacent pixels 201 to each other, thereby averaging the noise signals.

The pixel 201 may have a function for changing the sensitivity. The pixel 201 can include, for example, a first sensitivity change switch 380, a second sensitivity change switch 382, and a circuit element associated with them. When a first change signal WIDE1 changes to active level, the first sensitivity change switch 380 is turned on, so the capacitance value of a first additional capacitance 381 is added to that of the charge/voltage conversion unit CVC. This lowers the sensitivity of the pixel 201. When a second change signal WIDE2 changes to active level, the second sensitivity change switch 382 is turned on, so the capacitance value of a second additional capacitance 383 is added to that of the charge/voltage conversion unit CVC. This further lowers the sensitivity of the pixel 201.

In this manner, adding a function of lowering the sensitivity of the pixel 201 makes it possible to receive a larger amount of light, thus widening the dynamic range. When the first change signal WIDE1 changes to active level, an enable signal $EN_W$ may be changed to active level to enable a PMOS transistor 385 to perform a source follower operation, in addition to enabling the PMOS transistor 303 to perform a source follower operation.

Figure 4A:
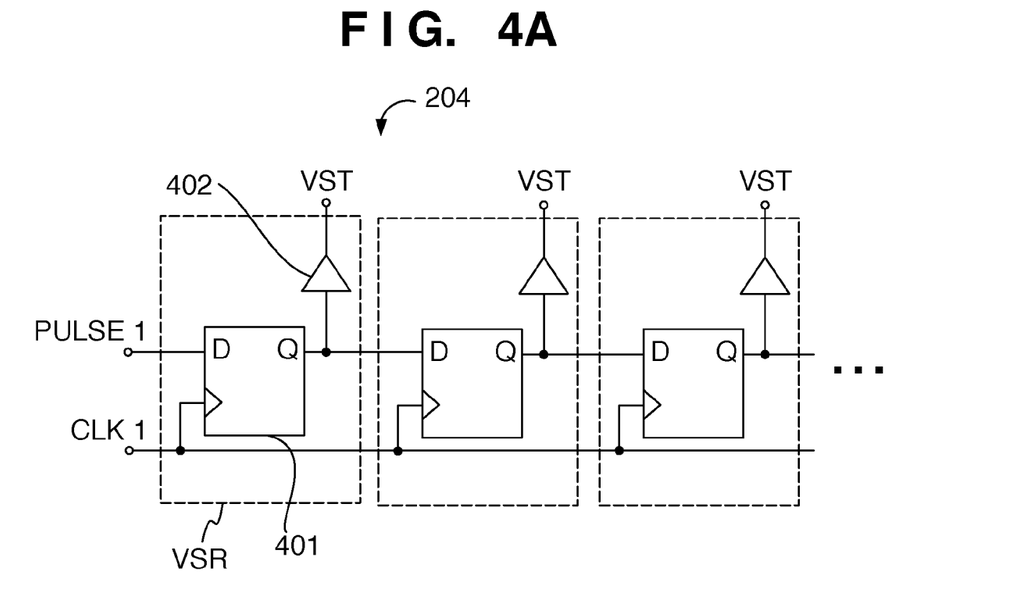
FIGS. 4A and 4B explain an example of the arrangements of shift registers according to the embodiment of the present invention.

Although the vertical scanning circuit 204 can have various arrangements, it can have an arrangement shown in, for example, FIG. 4A. In the vertical scanning circuit 204 shown in FIG. 4A, each unit vertical scanning circuit VSR includes one D-type flip-flop 401, and the first clock CLK1 is supplied to the clock input of the D-type flip-flop 401. The first pulse signal PULSE1 is supplied to the D input of the D-type flip-flop 401 of the unit vertical scanning circuit VSR in the first stage, and received in response to the first clock CLK1. The D-type flip-flop 401 in the first stage outputs a pulse signal having a duration corresponding to one cycle of the first clock CLK1 from its Q output. The Q output of the D-type flip-flop 401 of each unit vertical scanning circuit VSR is used to select a row to which the unit vertical scanning circuit VSR belongs, and is output as a row select signal VST via, for example, a buffer 402. The Q output of the D-type flip-flop 401 of each unit vertical scanning circuit VSR is connected to the D input of the D-type flip-flop 401 of the unit vertical scanning circuit VSR in the next stage.

Figure 4B:
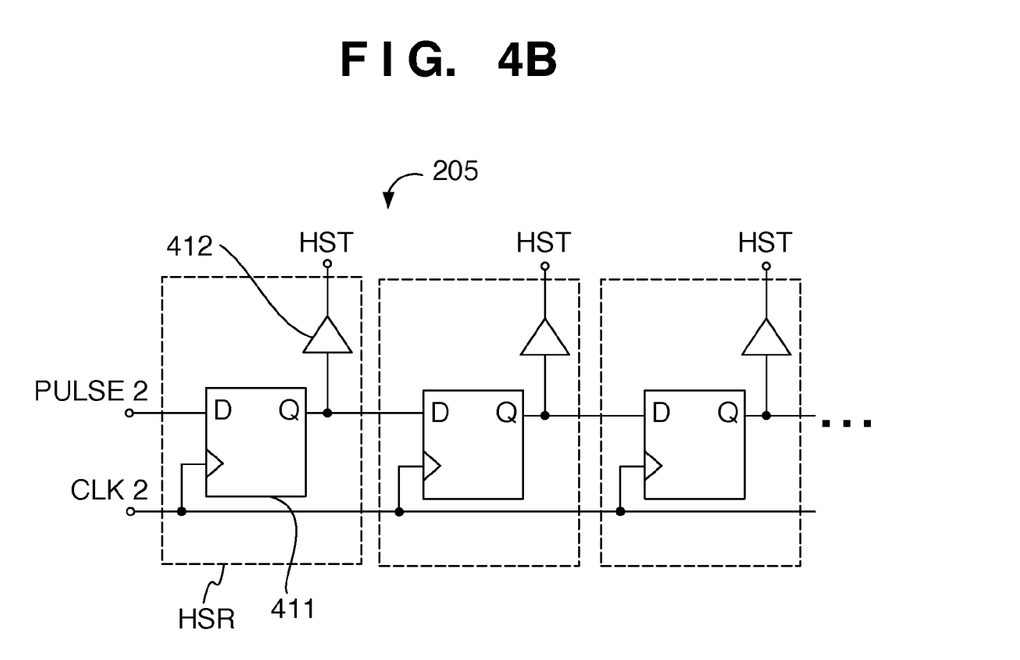

Although the horizontal scanning circuit 205 can have various arrangements, it can have an arrangement shown in, for example, FIG. 4B. In the horizontal scanning circuit 205 shown in FIG. 4B, each unit horizontal scanning circuit HSR includes one D-type flip-flop 411, and the second clock CLK2 is supplied to the clock input of the D-type flip-flop 411. The second pulse signal PULSE2 is supplied to the D input of the D-type flip-flop 411 of the unit horizontal scanning circuit HSR in the first stage, and received in response to the second clock CLK2. The unit horizontal scanning circuit HSR in the first stage outputs a pulse signal having a duration corresponding to one cycle of the second clock CLK2 from its Q output. The Q output of each unit horizontal scanning circuit HSR is used to select a column to which the unit horizontal scanning circuit HSR belongs, and is output as a column select signal HST via, for example, a buffer 412. The Q output of each unit horizontal scanning circuit HSR is connected to the D input of the D-type flip-flop 411 of the unit horizontal scanning circuit HSR in the next stage. Note that the vertical scanning period that is the scanning period of the vertical scanning circuit 204 is obtained by multiplying the horizontal scanning period of the horizontal scanning circuit 205 by the number of rows in the pixel array GA. The horizontal scanning period is the period of time required to scan all columns in the pixel array GA. Hence, the frequency of the second clock CLK2 supplied to the horizontal scanning circuit 205 which generates the column select signal HST used to select a column is greatly higher than that of the first clock CLK1 supplied to the vertical scanning circuit 204 which generates the row select signal VST used to select a row.

Figure 5:
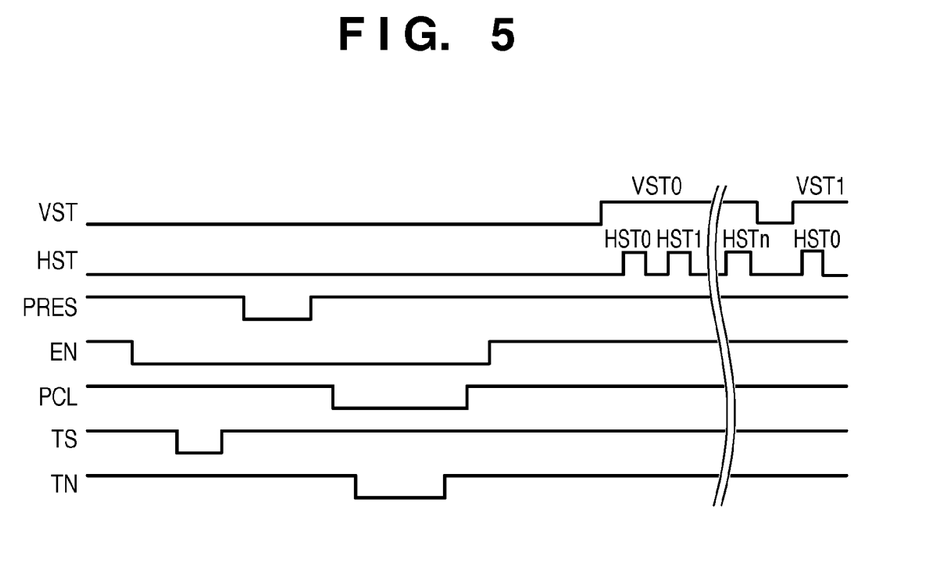
FIG. 5 explains an example of a timing chart according to the embodiment of the present invention.

Main signals supplied to each pixel 201 will be described with reference to FIG. 5. The reset signal PRES, enable signal EN, clamp signal PCL, light signal sampling signal TS, and noise sampling signal TN are low-active signals. Although not shown in FIG. 5, the enable signal EN0 can be a signal similar to the enable signal EN. Also, although not shown in FIG. 5, the enable signal $EN_W$ can make a transition in the same way as in the enable signal EN when the first change signal WIDE1 becomes active.

First, the enable signal EN becomes active on all rows in the pixel array GA, and the light signal sampling signal TS changes to active level in a pulsed pattern, so a light signal is written in the capacitance 342. Next, the reset signal PRES changes to active level in a pulsed pattern, so the potential of the charge/voltage conversion unit CVC is reset. The clamp signal PCL changes to active level in a pulsed pattern. When the clamp signal PCL is at active level, the noise sampling signal TN changes to active level in a pulsed pattern, so noise is written in the capacitance 362.

A unit vertical scanning circuit VSR corresponding to the first row of the vertical scanning circuit 204 changes its row select signal VST (VST0) to active level. This means that the vertical scanning circuit 204 selects the first row of the pixel array GA. In this state, unit horizontal scanning circuits HSR corresponding to the first to last columns of the horizontal scanning circuit 205 change their column select signals HST (HST0-HSTn) to active level. This means that the horizontal scanning circuit 205 sequentially selects the first to last columns of the pixel array GA. Thus, light signals and noise signals of pixels on the first to last columns on the first row of the pixel array GA are output from the output amplifiers 210a and 210b, respectively. After that, a unit vertical scanning circuit VSR corresponding to the second row of the vertical scanning circuit 204 changes its row select signal VST (VST1) to active level. Unit horizontal scanning circuits HSR corresponding to the first to last columns of the horizontal scanning circuit 205 change their column select signals HST (HST0-HSTn) to active level. By performing such an operation for the first to last rows, one image is output from the pixel array GA.

Figure 6A:
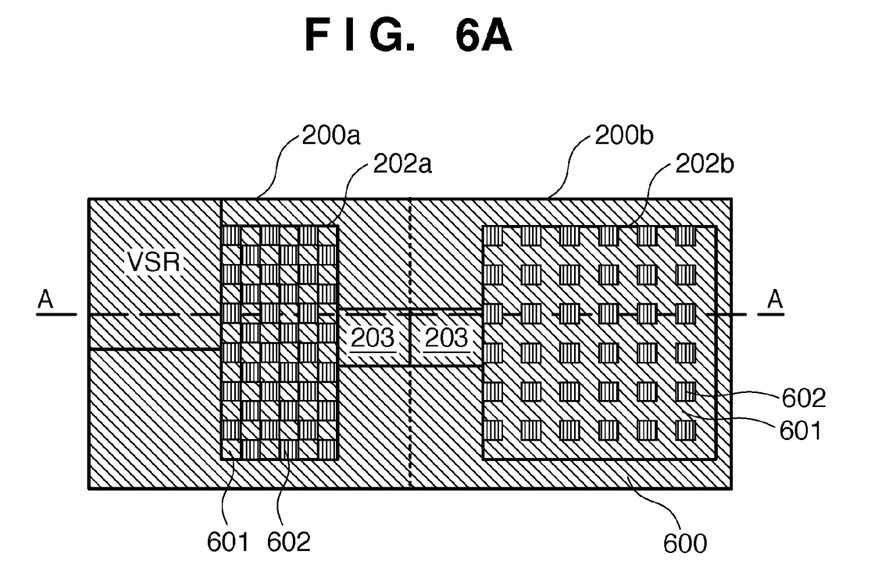
FIGS. 6A and 6B are views for explaining a light shielding layer 600 according to an embodiment of the present invention.
Figure 6B:
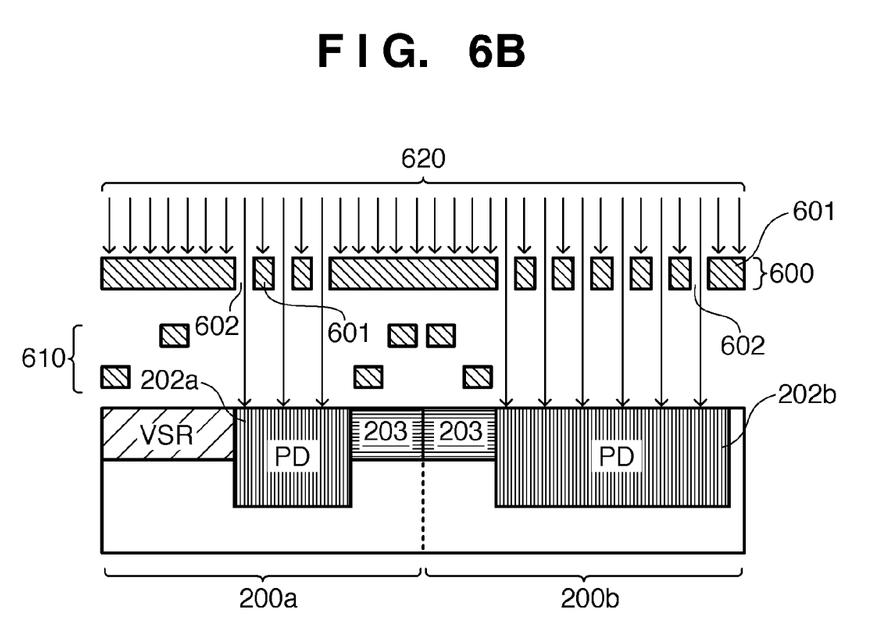

A solid-state imaging apparatus 100 according to an embodiment of the present invention further includes a light shielding layer 600. The light shielding layer 600 of this embodiment will be described with reference to FIGS. 6A and 6B. FIGS. 6A and 6B place focus on, out of unit cells 200 of a pixel array GA shown in FIG. 2, a first unit cell 200a including a unit vertical scanning circuit VSR and a second unit cell 200b including neither the unit vertical scanning circuit VSR nor a unit horizontal scanning circuit HSR. FIG. 6A is a plan view of the first unit cell 200a and the second unit cell 200b. FIG. 6B is a sectional view taken along a line A-A.

The pixel included in the first unit cell 200a is called a first pixel, and the pixel included in the second unit cell 200b is called a second pixel. The first unit cell 200a includes the unit vertical scanning circuit VSR. A first photoelectric conversion element 202a is adjacent to the unit vertical scanning circuit VSR. On the other hand, the second unit cell 200b includes neither the unit vertical scanning circuit VSR nor the unit horizontal scanning circuit HSR. That is, a second photoelectric conversion element 202b is adjacent to neither scanning circuit. No photoelectric conversion element 202 can be overlaid in the region of the unit vertical scanning circuit VSR. Hence, the area of the first photoelectric conversion element 202a is smaller than that of the second photoelectric conversion element 202b on the planar view. For this reason, when incident light 620 irradiates the whole surface of the photoelectric conversion elements, the sensitivity of the first photoelectric conversion element 202a can be lower than that of the second photoelectric conversion element 202b. In this embodiment, the light shielding layer 600 partially covers the first photoelectric conversion element 202a and the second photoelectric conversion element 202b, thereby reducing the sensitivity difference between the first pixel and the second pixel.

The light shielding layer 600 is arranged at a position to cover the unit cells 200a and 200b. That is, the light shielding layer 600 covers the photoelectric conversion elements 202a and 202b, in-pixel readout circuits 203, and the unit vertical scanning circuit VSR. At the position to cover each of the photoelectric conversion elements 202a and 202b, the light shielding layer 600 can have a light shielding portion 601 and an aperture 602. The light shielding portion 601 partially shields the light 620 incident on the photoelectric conversion elements 202a and 202b. On the other hand, the aperture 602 is arranged at the position to cover each of the photoelectric conversion elements 202a and 202b to pass the remaining component of the incident light 620. That is, the incident light 620 passing through the apertures 602 can irradiate the photoelectric conversion elements 202a and 202b.

In this embodiment, the light shielding layer 600 is formed such that the light shielding portion 601 covering the second photoelectric conversion element 202b has an area larger than that of the light shielding portion 601 covering the first photoelectric conversion element 202a. This allows to make the decrease amount of the sensitivity of the second pixel by the light shielding layer 600 larger than the decrease amount of the sensitivity of the first pixel by the light shielding layer 600. The light shielding layer 600 may be formed such that the area of the aperture 602 covering the first photoelectric conversion element 202a equals that of the aperture 602 covering the second photoelectric conversion element 202b. When the aperture 602 covering one photoelectric conversion element includes a plurality of aperture portions, as shown in FIGS. 6A and 6B, the area of the aperture 602 covering one photoelectric conversion element indicates the total area of the plurality of aperture portions. Thus equalizing the areas of the apertures 602 can equalize the sensitivities of the first and second pixels.

In this embodiment, the light shielding layer 600 can be made of a third aluminum layer on a wiring layer 610 formed from a first aluminum layer and a second aluminum layer. The light shielding layers covering the photoelectric conversion elements, the light shielding layer covering the unit vertical scanning circuit VSR, and the light shielding layers covering the in-pixel readout circuits 203 can be formed either in the same layer, as shown in FIG. 6B, or in separate layers. The light shielding layer 600 of this embodiment has, as the apertures 602, a plurality of aperture portions that are periodically arranged. This enables each photoelectric conversion element 202 to uniformly receive the light 620 incident on its respective portions.

FIGS. 6A and 6B place focus on the first unit cell 200a including the unit vertical scanning circuit VSR and the second unit cell 200b including no unit scanning circuit. Similarly, the unit cell 200 including the unit horizontal scanning circuit HSR or the unit cell 200 including both the unit scanning circuits in the vertical and horizontal directions also has an area smaller than that of the second unit cell 200b on the planar view of the photoelectric conversion elements. For the unit cells 200 as well, the light shielding layer 600 may be formed such that the area of the light shielding portion 601 covering the photoelectric conversion element 202 becomes smaller than that in the second unit cell 200b. This embodiment is generally applicable when the apparatus includes at least two types of pixels with different areas on the planar view of the photoelectric conversion elements 202. The light shielding layer 600 can be formed such that the larger the area of a pixel 201 on the planar view of the photoelectric conversion element 202 is, the larger the area of the light shielding portion 601 that shields the light 620 incident on the photoelectric conversion element 202 is.

Figure 7A:
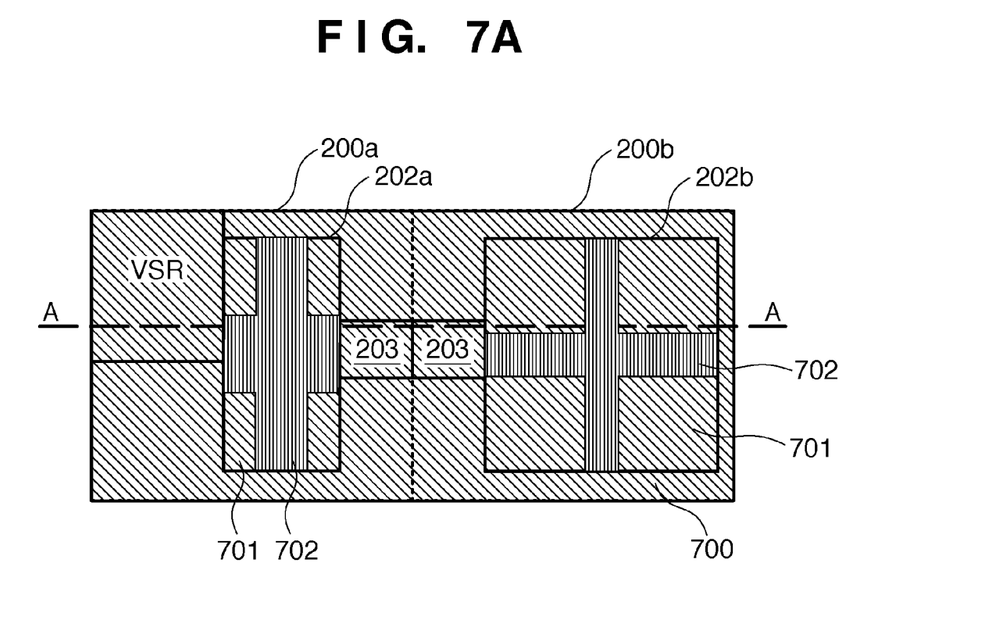
FIGS. 7A and 7B are views for explaining a light shielding layer 700 according to another embodiment of the present invention.
Figure 7B:
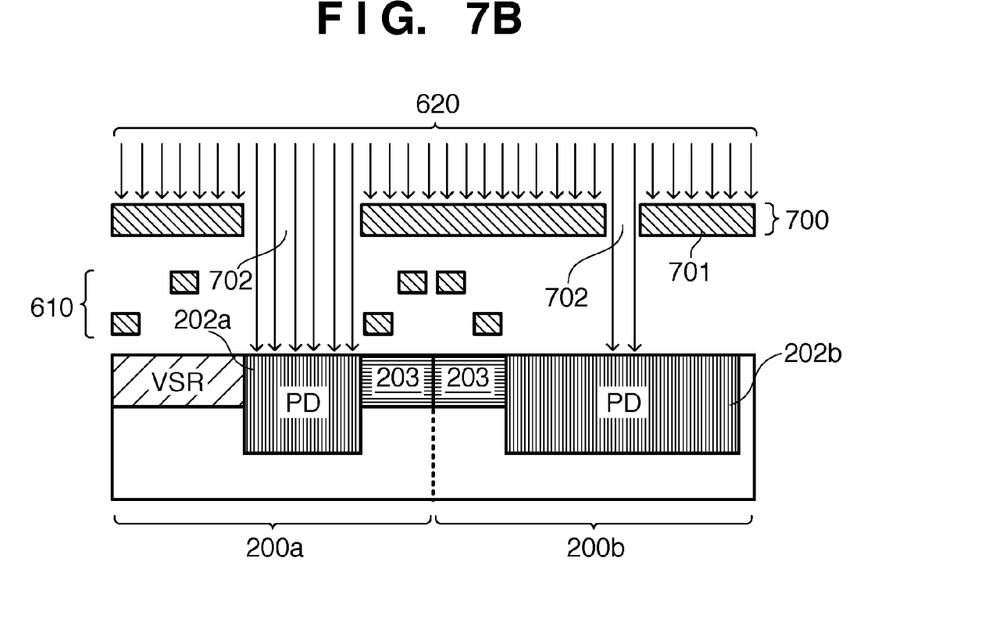

A solid-state imaging apparatus according to another embodiment of the present invention will be described next with reference to FIGS. 7A and 7B. The solid-state imaging apparatus according to this embodiment includes a light shielding layer 700. FIGS. 7A and 7B are the same as FIGS. 6A and 6B except the shape of the light shielding layer 700. Hence, only the light shielding layer 700 will be explained below, and a repetitive description will be omitted. A light shielding portion 701 of the light shielding layer 700 is arranged at a position to cover the four corners of each of photoelectric conversion elements 202a and 202b. A cruciform aperture 702 is consequently formed. In this embodiment as well, the light shielding layer 700 is formed such that the light shielding portion 701 covering the photoelectric conversion element 202b of the second pixel has an area larger than that of the light shielding portion 701 covering the photoelectric conversion element 202a of the first pixel. The light shielding layer 700 may be formed such that the area of the aperture 702 covering the photoelectric conversion element 202a of the first pixel equals that of the aperture 702 covering the photoelectric conversion element 202b of the second pixel.

Figure 8A:
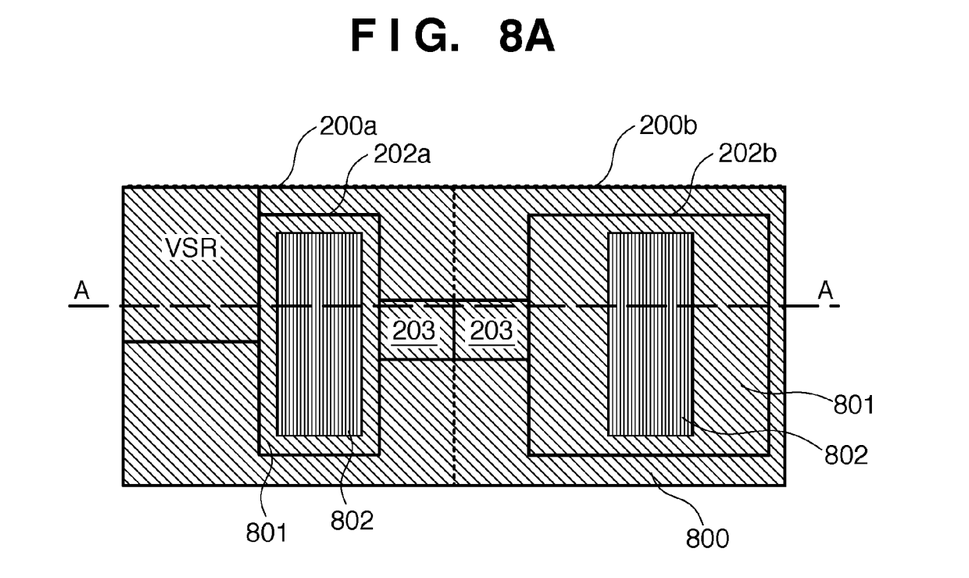
FIGS. 8A and 8B are views for explaining a light shielding layer 800 according to still another embodiment of the present invention.
Figure 8B:
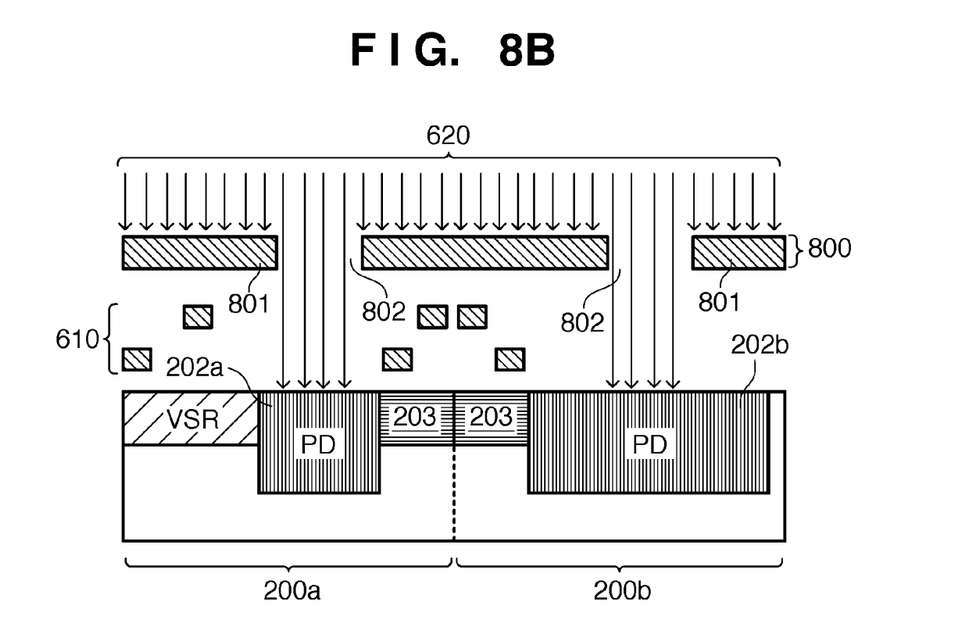

A solid-state imaging apparatus according to still another embodiment of the present invention will be described next with reference to FIGS. 8A and 8B. The solid-state imaging apparatus according to this embodiment includes a light shielding layer 800. FIGS. 8A and 8B are the same as FIGS. 6A and 6B except the shape of the light shielding layer 800. Hence, only the light shielding layer 800 will be explained below, and a description of the remaining parts will be omitted. A light shielding portion 801 of the light shielding layer 800 is arranged at a position to annularly cover the outer region of each of photoelectric conversion elements 202a and 202b. A rectangular aperture 802 covering the inner region of each of the photoelectric conversion elements 202a and 202b is consequently formed. In this embodiment as well, the light shielding layer 800 is formed such that the light shielding portion 801 covering the photoelectric conversion element 202b of the second pixel has an area larger than that of the light shielding portion 801 covering the photoelectric conversion element 202a of the first pixel. The light shielding layer 800 may be formed such that the area of the aperture 802 covering the photoelectric conversion element 202a of the first pixel equals that of the aperture 802 covering the photoelectric conversion element 202b of the second pixel. The apertures 802 covering the photoelectric conversion elements 202 may have the same shape. Forming the aperture 802 at a position to cover the inner region of the photoelectric conversion element 202, as in the light shielding layer 800, is advantageous when condensing incident light 620 by, for example, a microlens.

Figure 9:
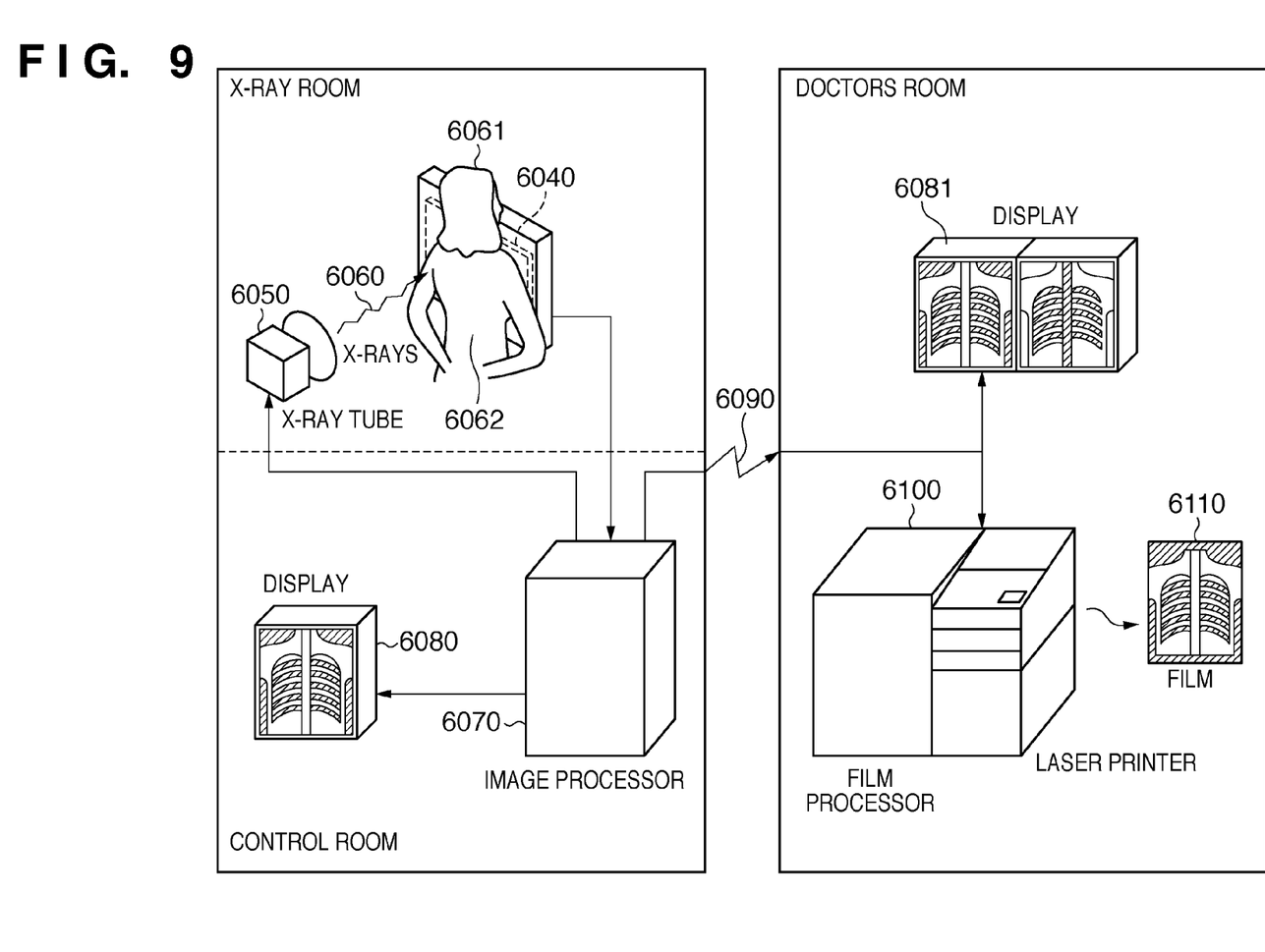
FIG. 9 illustrates a radiation imaging system according to an embodiment of the present invention.

FIG. 9 illustrates an example in which the solid-state imaging apparatus according to the present invention is applied to an X-ray diagnostic system (radiation imaging system). The radiation imaging system includes a radiation imaging apparatus 6040 and an image processor 6070 which processes a signal output from the radiation imaging apparatus 6040. The radiation imaging apparatus 6040 serves as an apparatus to which the solid-state imaging apparatus 100 mentioned above is applied so as to capture radiation as illustrated in FIG. 1B. X-rays 6060 emitted by an X-ray tube (radiation source) 6050 are transmitted through a chest 6062 of a patient or a subject 6061, and enter the radiation imaging apparatus 6040. The incident X-rays bear the information of the interior of the body of the subject 6061. The image processor (processor) 6070 processes a signal (image) output from the radiation imaging apparatus 6040, and can display the image on, for example, a display 6080 in a control room based on the signal obtained by processing.

Also, the image processor 6070 can transfer the signal obtained by processing to a remote site via a transmission path 6090. This makes it possible to display the image on a display 6081 placed in, for example, a doctor room at another site or record the image on a recording medium such as an optical disk. The recording medium may be a film 6110, and a film processor 6100 records the image on the film 6110 in this case.

The solid-state imaging apparatus according to the present invention is also applicable to an imaging system which captures an image of visible light. Such an imaging system can include, for example, the solid-state imaging apparatus 100 and a processor which processes a signal output from the solid-state imaging apparatus 100. The processing by the processor can include at least one of, for example, processing of converting the image format, processing of compressing the image, processing of changing the image size, and processing of changing the image contrast.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-155259, filed Jul. 7, 2010, which is hereby incorporated by reference herein in its entirety.

What is claimed is:
1. A solid-state imaging apparatus including a plurality of pixels each including a photoelectric conversion element, and a light shielding layer covering the photoelectric conversion element, wherein
for each of the photoelectric conversion elements of the plurality of pixels, the light shielding layer includes a light shielding portion which shields a portion of inci- dent light to the photoelectric conversion element, and an aperture which passes another portion of the incident light, the plurality of pixels include a first pixel and a second pixel, the area of the photoelectric conversion element included in the first pixel is larger than the area of the photoelectric conversion element included in the second pixel on the planar view, and an area of the light shielding portion that shields a portion of the incident light to the photoelectric conversion element included in the first pixel is larger than an area of the light shielding portion that shields a portion of the incident light to the photoelectric conversion element included in the second pixel.

2. The apparatus according to claim 1, wherein areas of the apertures for the photoelectric conversion elements of the first pixel and the second pixel equal to each other.

3. The apparatus according to claim 2, wherein the aperture includes a plurality of aperture portions that are periodically arranged.

4. The apparatus according to claim 2, wherein the aperture has a cruciform shape.

5. The apparatus according to claim 2, wherein the aperture has a rectangular shape.

6. The apparatus according to claim 1, further comprising a scanning circuit configured to scan signals output from the plurality of pixels, wherein the second pixel is adjacent to the scanning circuit, and the first pixel is not adjacent to the scanning circuit.

7. The apparatus according to claim 1, further comprising a scintillator.

8. An imaging system comprising:
a solid-state imaging apparatus according to claim 1; and
a processor configured to process a signal output from the solid-state imaging apparatus.

* * * * *